US009363895B2

(12) United States Patent
Matsuzawa et al.

(10) Patent No.: US 9,363,895 B2
(45) Date of Patent: Jun. 7, 2016

(54) CIRCUIT SUBSTRATE, ELECTRONIC DEVICE, METHOD OF MANUFACTURING ELECTRONIC DEVICE, ELECTRONIC APPARATUS, AND MOVING OBJECT

(71) Applicant: Seiko Epson Corporation, Tokyo (JP)

(72) Inventors: Juichiro Matsuzawa, Minowa (JP); Masaru Mikami, Minowa (JP); Toshiya Usuda, Ina (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/249,707

(22) Filed: Apr. 10, 2014

(65) Prior Publication Data

US 2014/0305687 A1 Oct. 16, 2014

(30) Foreign Application Priority Data

Apr. 12, 2013 (JP) ................. 2013-083822

(51) Int. Cl.
| H05K 1/16 | (2006.01) |
| H05K 1/18 | (2006.01) |
| H03H 9/215 | (2006.01) |
| H05K 1/02 | (2006.01) |
| H03H 9/05 | (2006.01) |

(52) U.S. Cl.
CPC ............. *H05K 1/18* (2013.01); *H03H 9/0542* (2013.01); *H03H 9/0552* (2013.01); *H03H 9/215* (2013.01); *H03H 9/0509* (2013.01); *H05K 1/0268* (2013.01); *H05K 2203/162* (2013.01); *Y10T 29/49004* (2015.01)

(58) Field of Classification Search
CPC ... H03H 9/0542; H03H 9/0552; H03H 9/215; H03H 9/0514; H03H 9/0547; H03H 9/1021; H05K 1/18
See application file for complete search history.

(56) References Cited

U.S. PATENT DOCUMENTS

| 5,585,687 | A | * | 12/1996 | Wakabayashi | ....... H03H 9/1014 310/344 |
| 5,900,790 | A | * | 5/1999 | Unami | ................. H03H 9/0514 310/321 |
| 5,949,294 | A | * | 9/1999 | Kondo et al. | .................... 331/68 |
| 7,378,780 | B2 | | 5/2008 | Mizumura et al. | |
| 2003/0107444 | A1 | * | 6/2003 | Ieki et al. | ................ 331/107 SL |
| 2005/0184625 | A1 | * | 8/2005 | Miyazaki | ....................... 310/348 |
| 2007/0075796 | A1 | * | 4/2007 | Mizumura et al. | ............ 331/158 |
| 2011/0109394 | A1 | * | 5/2011 | Sato et al. | ........................ 331/68 |
| 2012/0242195 | A1 | * | 9/2012 | Shimao | ................ H03H 9/1021 310/365 |
| 2013/0214645 | A1 | * | 8/2013 | Mizusawa | ............... H01L 41/29 310/344 |

FOREIGN PATENT DOCUMENTS

| JP | 2006-054321 A | 2/2006 |
| JP | 2007-142869 A | 6/2007 |
| JP | 2010-068061 A | 3/2010 |

* cited by examiner

*Primary Examiner* — Steven T Sawyer
(74) *Attorney, Agent, or Firm* — Harness, Dickey & Pierce, P.L.C.

(57) ABSTRACT

A circuit substrate includes a base substrate provided with a first pad and a second pad which are electrically connected to an electronic component, a first lateral face and a second lateral face, a first terminal electrically connected to the first pad and a second terminal electrically connected to the second pad which are disposed on the first lateral face, and a third terminal and a fourth terminal which are disposed on the second lateral face. The first terminal and the fourth terminal are located at point-symmetric positions to a center of the base substrate. The second terminal and the third terminal are located at point-symmetric positions to the center of the base substrate. The third terminal and the fourth terminal are electrically connected to each other.

18 Claims, 6 Drawing Sheets

CIRCUIT SUBSTRATE, ELECTRONIC DEVICE, METHOD OF MANUFACTURING ELECTRONIC DEVICE, ELECTRONIC APPARATUS, AND MOVING OBJECT

BACKGROUND

1. Technical Field

The present invention relates to a circuit substrate, an electronic device, a method of manufacturing an electronic device, an electronic apparatus, and a moving object.

2. Related Art

Hitherto, as an example of an electronic device, there has been a resonation device having a resonator element (electronic component) connected into a package as a circuit substrate. In such a resonation device, when resonation frequency measurement at the time of the frequency adjustment of the resonator element, the measurement of the resonation characteristics of the resonator element, or the like is performed, it is necessary to measure the resonation characteristics of the resonator element connected into the package from the outside of the package. In order to cope with such measurement, a package and vibrator are disclosed which are configured such that an external terminal electrically connected to an internal connection terminal within the package connected to an excitation electrode of a resonator element is provided on a lateral surface of the package (see, for example, JP-A-2006-54321). A measurement terminal (measurement probe) is brought into contact with the external terminal, thereby allowing the resonation frequency, the resonation characteristics or the like of the resonator element to be measured.

However, in the package and the vibrator mentioned above, since the external terminal electrically connected to the excitation electrode of the resonator element is provided on one lateral face of the lateral surface of the package, the direction of a product is required to be kept constant at the time of the measurement. Specifically, for example, when the lateral face on the side which is not provided with the external terminal is assumed to be located at the measurement terminal side, the measurement terminal (measurement probe) is brought into contact with the lateral face of the package, and thus the measurement terminal is set to be in a so-called open state. In such a state, it cannot be determined whether a defect is present in the resonator element, or whether a defect is present in the contact of the measurement terminal, and thus there is a problem in that it takes considerable man-hours to lead to the determination, for example, the measurement is performed again by repeatedly performing the contact.

SUMMARY

An advantage of some aspects of the invention is to solve at least a part of the problems described above, and the invention can be implemented as the following forms or application examples.

APPLICATION EXAMPLE 1

This application example is directed to a circuit substrate including: a base substrate provided with a first pad and a second pad that allow electrical conduction to an electronic component; a first terminal which is provided on a first lateral face of the base substrate and allows electrical conduction to the first pad; a fourth terminal which is provided at a point-symmetric position to the first terminal with reference to a center of the base substrate; a second terminal which is provided on the first lateral face and allows electrical conduction to the second pad; and a third terminal which is provided at a point-symmetric position to the second terminal with reference to the center, wherein the third terminal and the fourth terminal are provided on a second lateral face of the base substrate and are electrically connected to each other.

According to the circuit substrate of this application example, the fourth terminal which is provided at a point-symmetric position to the first terminal provided on the first lateral face of the base substrate with reference to the center of the base substrate, and the third terminal which is provided at a point-symmetric position to the second terminal provided on the first lateral face of the base substrate with reference to the center of the base substrate are provided, and thus any pair of terminals out of a pair of terminals of the first terminal and the second terminal, and a pair of terminals of the third terminal and the fourth terminal are directed toward the measurement terminal even when the circuit substrate becomes point-symmetric. Further, the third terminal and the fourth terminal are electrically connected to each other. Therefore, when the pair of terminals (third terminal and fourth terminal) are measured, these terminals are set to be in an electrically connected state, and thus it is possible to reliably determine the direction of the circuit substrate through one-time measurement. Therefore, it is possible to provide a circuit substrate capable of confirmation with a small number of times of confirmation (determination) and with good efficiency.

APPLICATION EXAMPLE 2

This application example is directed to the circuit substrate according to the application example described above, wherein the third terminal and the fourth terminal are electrically short-circuited to each other.

According to this application example, since the third terminal and the fourth terminal are electrically short-circuited to each other, it is possible to determine a direction toward which the circuit substrate is directed by confirming (determining) a short circuit.

APPLICATION EXAMPLE 3

This application example is directed to the circuit substrate according to the application example described above, wherein the third terminal and the fourth terminal are electrically connected to each other through an electric resistor.

According to this application example, since the third terminal and the fourth terminal are electrically connected to each other by an electric resistor, it is possible to determine the presence or absence of a defect of the electronic component and the direction toward which the circuit substrate is directed, for example, by comparing electric resistance when the first terminal and the second terminal are short-circuited to each other with electric resistance between the third terminal and the fourth terminal.

APPLICATION EXAMPLE 4

This application example is directed to the circuit substrate according to the application example described above, wherein a fifth terminal is included in the base substrate, and the third terminal and the fourth terminal are electrically connected to the fifth terminal.

According to this application example, since the third terminal and the fourth terminal are electrically connected to the fifth terminal, it is possible to determine the presence or absence of a defect of the electronic component and the direction toward which the circuit substrate is directed, by confirming whether the potential of the first terminal and the second terminal is the same as the potential of the fifth terminal.

APPLICATION EXAMPLE 5

This application example is directed to the circuit substrate according to the application example described above, wherein the fifth terminal is a terminal which is connected to a ground.

According to this application example, since the fifth terminal is a terminal which is connected to a ground, the potentials of the third terminal and the fourth terminal can be stabilized, and thus it is possible to more reliably determine the presence or absence of a defect of the electronic component and a direction toward which the circuit substrate is directed.

APPLICATION EXAMPLE 6

This application example is directed to the circuit substrate according to the application example described above, wherein the first terminal and the second terminal are provided in a first concave portion included on the first lateral face, and the third terminal and the fourth terminal are provided in a second concave portion included on the second lateral face.

According to this application example, it is possible to perform measurement from the lateral face of the circuit substrate, and to simultaneously perform the measurement and processing from the plane side of the circuit substrate.

APPLICATION EXAMPLE 7

This application example is directed to an electronic device including the circuit substrate according to the application example described above; and an electronic component which is disposed in the circuit substrate, and is provided with a first connection terminal which is electrically connected to the first terminal and a second connection terminal which is electrically connected to the second terminal.

According to the electronic device of the application example, the first terminal and the third terminal, and the second terminal and the fourth terminal are respectively provided at point-symmetric positions to each other, and any pair of terminals of the first terminal and the second terminal, and the third terminal and the fourth terminal are directed toward the measurement terminal even when the circuit substrate becomes point-symmetric. Further, the first terminal connected to the first connection terminal of the electronic component and the second terminal connected to the second connection terminal of the electronic component are connected to each other, and the third terminal and the fourth terminal are electrically connected to each other. Thereby, when the first terminal and the second terminal are measured, the electronic component can be measured, and when the third terminal and the fourth terminal are measured, the terminals are set to be in a short-circuit state. Therefore, it is possible to reliably determine the direction of the electronic device (circuit substrate) through one-time measurement. Therefore, it is possible to provide an electronic device capable of reliable and efficient measurement with a small number of times of determination.

APPLICATION EXAMPLE 8

This application example is directed to a method of manufacturing an electronic device, including: preparing the electronic device having a circuit substrate provided with a base substrate having a first lateral face and a second lateral face, a first terminal and a second terminal which are disposed on the first lateral face, a fourth terminal which is disposed on the second lateral face and is located at a point-symmetric position to the first terminal with reference to a center of the base substrate, and a third terminal which is disposed on the second lateral face and is located at a point-symmetric position to the second terminal with reference to the center, the third terminal and the fourth terminal being electrically connected to each other, and an electronic component which is disposed in the circuit substrate, and is provided with a first connection terminal electrically connected to the first terminal and a second connection terminal electrically connected to the second terminal; firstly, bringing a measurement portion into contact with any pair of terminals of the first terminal and the second terminal, and the third terminal and the fourth terminal to measure characteristics thereof; and secondly, bringing the measurement portion into contact with the other pair of terminals different from the any pair of terminals of first terminal and the second terminal, and the third terminal and the fourth terminal, in cases other than a desired electrical conduction state in the first measurement, to measure characteristics thereof.

According to the method of manufacturing an electronic device of this application example, it is possible to determine a defect of the electronic component or a mismatch of the direction of the electronic device in the first measurement. In a case of the mismatch of the direction of the electronic device, the measurement is performed again in the second measurement by correcting the direction, and thus it is possible to provide a method of manufacturing an electronic device which is capable of efficient measurement.

APPLICATION EXAMPLE 9

This application example is directed to an electronic apparatus including the circuit substrate according to the application example described above.

According to the application example, since a circuit substrate capable of reliable and efficient confirmation with a small number of times of confirmation is included, it is possible to provide an electronic apparatus having a reduction in costs and more stable performance.

APPLICATION EXAMPLE 10

This application example is directed to a moving object including the circuit substrate according to the application example described above.

According to this application example, since a circuit substrate capable of reliable and efficient confirmation with a small number of times of confirmation is included, it is possible to provide a moving object having a reduction in costs and more stable performance.

BRIEF DESCRIPTION OF THE DRAWINGS

The invention will be described with reference to the accompanying drawings, wherein like numbers reference like elements.

FIGS. 1A to 1C are diagrams illustrating an outline of an electronic device according to a first embodiment of the invention.

FIGS. 3A to 3C are diagrams illustrating an outline of an electronic device according to a second embodiment of the invention.

DESCRIPTION OF EXEMPLARY EMBODIMENTS

Figure 1A:
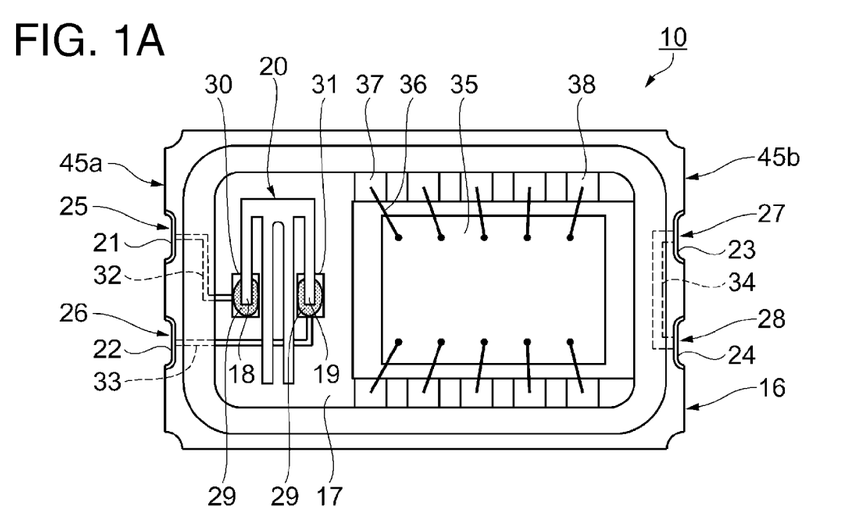
FIG. 1A is a plan view.
Figure 1B:
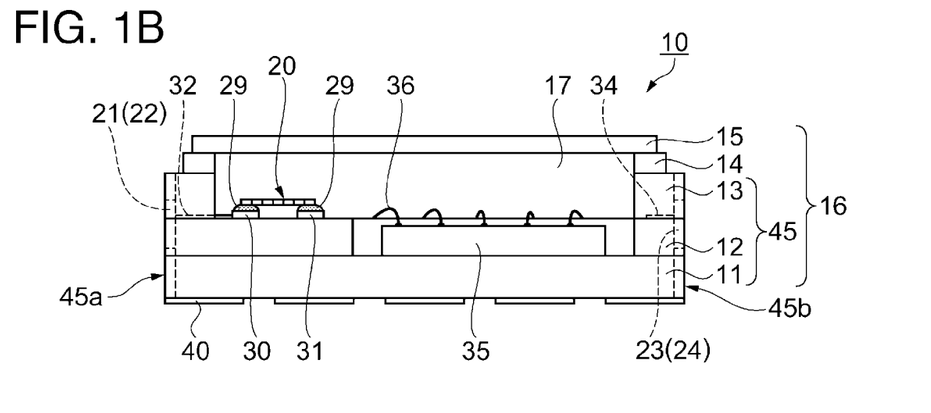
FIG. 1B is a front cross-sectional view.
Figure 1C:
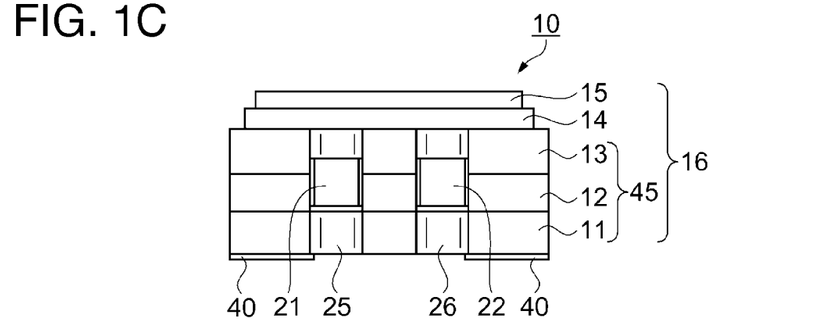
FIG. 1C is a left side view of FIG. 1B.
Figure 2:
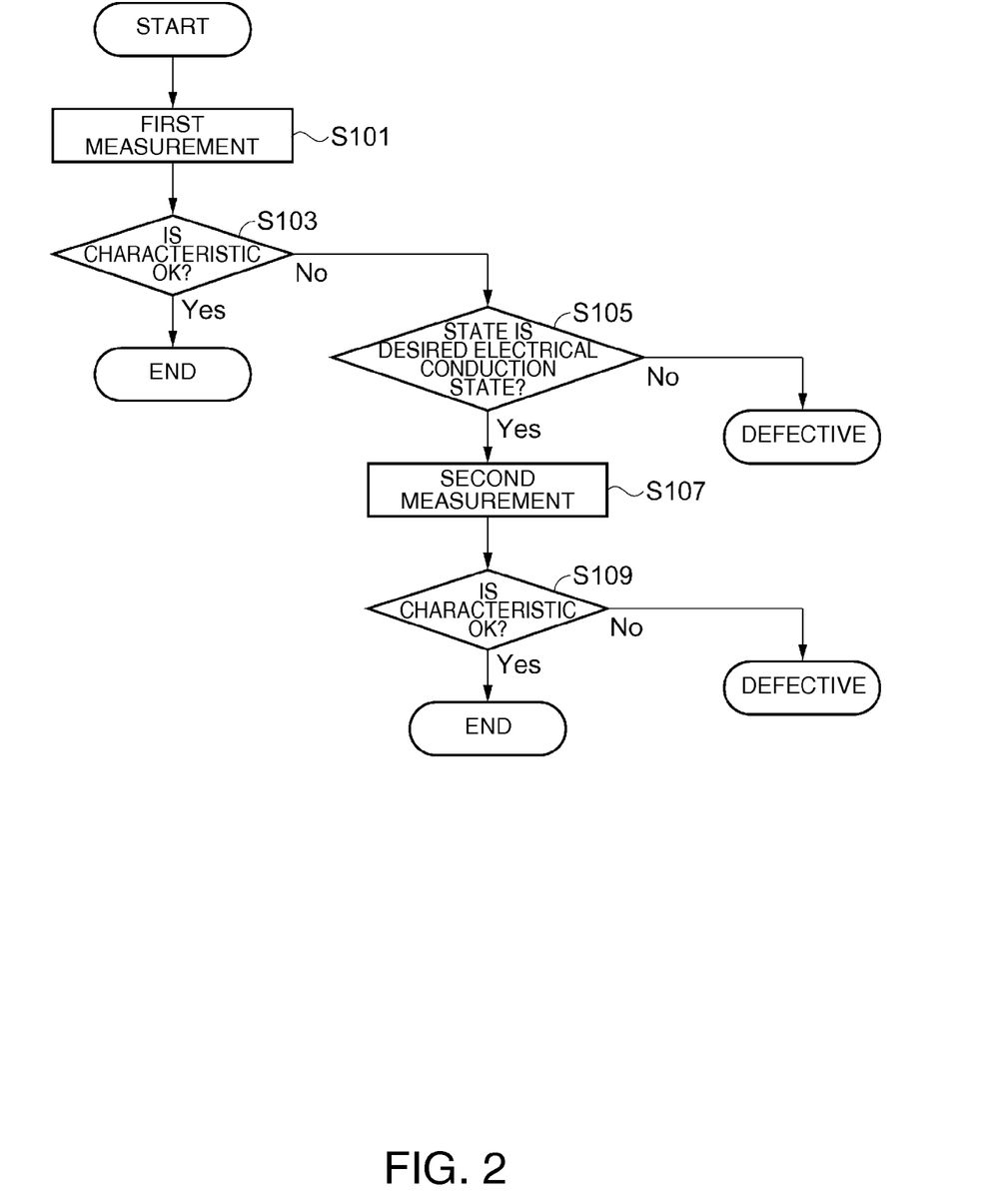
FIG. 2 is a flow diagram illustrating an example of a method of manufacturing the electronic device according to the first embodiment.

Hereinafter, preferred embodiments of the invention will be described with reference to the accompanying drawings.
First Embodiment An electronic device according to a first embodiment of the invention will be described with reference to FIGS. 1A to 1C and FIG. 2. FIGS. 1A to 1C are diagrams illustrating an outline of an electronic device according to the first embodiment of the invention; FIG. 1A is a plan view in which a lid as a lid member is omitted, FIG. 1B is a front cross-sectional view, and FIG. 1C is a left side view when FIG. 1B is seen from the left side. FIG. 2 is a flow diagram illustrating an example of a method of manufacturing the electronic device according to the first embodiment. Meanwhile, in the following, the electronic device according to the first embodiment will be described by taking an example of an oscillator including a tuning fork type resonator element as an electronic component.

An oscillator 10 as the electronic device according to the first embodiment which is shown in FIGS. 1A to 1C includes a tuning fork type resonator element 20, a circuit element 35 having at least a function of driving the resonator element 20, and a package 16 that stores the resonator element 20 and the circuit element 35. Hereinafter, components thereof will be sequentially described in detail.
Package The package 16 as a circuit substrate includes abase substrate 45 which is provided with a bottom plate 11, a first sidewall 12 as a frame-like first layer sidewall provided in the periphery of the surface of the bottom plate 11, and a second sidewall 13 as a frame-like second layer sidewall provided on the upper surface of the first sidewall 12, a seam ring 14 as a bonding material provided on the upper surface of the second sidewall 13, and a lid 15 as a lid member bonded to the second sidewall 13 through the seam ring 14. The package 16 has a function, as a storage container, of storing the resonator element 20, the circuit element 35 and the like.

The package 16 as a circuit substrate has a concave portion (internal space 17) opened on the upper surface. An opening of the concave portion is blocked by the lid 15 bonded to the second sidewall 13 through the seam ring 14 as a bonding material. The opening of the concave portion of the package 16 is blocked and thus the sealed internal space 17 is formed. The internal pressure of the sealed internal space 17 can be set to a desired atmospheric pressure. For example, the internal pressure is set to the atmospheric pressure in which a nitrogen gas is filled into the internal space 17, or is set to a vacuum (state of a space filled with a gas of a pressure ($1 \times 10^5$ Pa to $1 \times 10^{-10}$ Pa or lower (JIS Z 8126-1: 1999)) lower than the normal atmospheric pressure), and thus it is possible for more stable resonation of the resonator element 20 to continue. Meanwhile, the internal space 17 of the present embodiment stores the tuning fork type resonator element 20, and thus is set to have the above-mentioned vacuum.

The frame-like first sidewall 12 and the second sidewall 13 are provided in a substantially rectangular circumferential shape. In other words, the opening shape opened on the upper surface of the above concave portion is substantially rectangular. The first sidewall 12 is provided with an inner end having a lateral face which is located further toward the center side, in other words, the inner side of the package 16 than the second sidewall 13, and includes a portion having a stepped portion formed within the concave portion. The stepped portion formed by the first sidewall 12 is provided with PAD electrodes 37, a first pad 30, a second pad 31 and the like. The plate-like bottom plate 11 and the concave portion surrounded by the frame-like first sidewall 12 and the second sidewall 13 serve as the internal space (storage space) 17 for storing the resonator element 20, the circuit element 35 and the like. The seam ring 14 formed of an alloy such as, for example, Kovar is provided on the upper surface of the frame-like second sidewall 13. The seam ring 14 has a function as a bonding material between the lid 15 and the second sidewall 13, and is provided in a frame shape (substantially rectangular circumferential shape) along the upper surface of the second sidewall 13.

The base substrate 45 is formed of a material having a thermal expansion coefficient which is consistent with, or as close as possible to, the thermal expansion coefficients of the resonator element 20 and the lid 15. In this example, ceramic is used. The base substrate 45 is formed by laminating and sintering a green sheet formed in a predetermined shape. Meanwhile, the green sheet is, for example, a material in which a kneaded material generated by dispersing ceramic powder in a predetermined solution and adding a binder is formed in a sheet shape.

The plurality of PAD electrodes 37, the first pad 30, the second pad 31 and the like are formed on the stepped portion of the first sidewall 12. The plurality of PAD electrodes 37, the first pad 30, and the second pad 31 are formed by performing baking after the formation of required shapes using, for example, a conductive paste such as a silver and palladium alloy or tungsten metallization, and then plating nickel (Ni), gold (Au), silver (Ag) or the like. The first pad 30 and the second pad 31 are connected to a first connection electrode (not shown) and a second connection electrode (not shown) which are provided in support arms 18 and 19 of the resonator element 20. The first pad 30 is electrically connected to a first terminal 21, provided in a first concave portion 25 of a first lateral face 45a of the base substrate 45, through a wiring 32. The second pad 31 is electrically connected to a second terminal 22, provided in a second concave portion 26 of the first lateral face 45a of the base substrate 45, through a wiring 33. Therefore, one excitation electrode (not shown) of the resonator element 20 is electrically connected to the first terminal 21 through the first connection electrode, the first pad 30, and the wiring 32. In addition, the other excitation electrode (not shown) of the resonator element 20 is electrically connected to the second terminal 22 through the second connection electrode, the second pad 31, and the wiring 33. The plurality of PAD electrodes 37 are electrically connected to any of external connection terminals 40 through a wiring which is not shown. Meanwhile, the wirings 32 and 33 can be formed as is the case with the PAD electrode 37 and the like.

As described above, the resonator element 20 is configured such that the first connection electrode (not shown) and the second connection electrode (not shown) provided in the support arms 18 and 19 are attached to the first pad 30 and the second pad 31 provided in the stepped portion by a connection material such as a conductive adhesive 29 so as to be electrically connected to each other. In addition, the circuit element 35 described later is attached onto the bottom plate 11 by a resin-based adhesive (not shown) or the like.

Two lateral faces (first lateral face 45a and second lateral face 45b) on the short side of the base substrate 45 are provided with two concave portions (castellation) reaching from the top face of the second sidewall 13 to the bottom plate 11, respectively, on the first lateral face 45a and the second lateral face 45b. The first lateral face 45a on the side where the resonator element 20 is disposed is provided with the first concave portion 25 and the second concave portion 26. In addition, a third concave portion 27 and a fourth concave portion 28 are provided on the second lateral face 45b on the side facing the first lateral face 45a provided with the first concave portion 25 and the second concave portion 26, that is, the second lateral face 45b on the side where the circuit element 35 is provided. The first terminal 21 is provided on the inner wall of the first concave portion 25 applied to the first sidewall 12 and the second sidewall 13. In addition, the second terminal 22 is provided on the inner wall of the second concave portion 26 applied to the first sidewall 12 and the second sidewall 13. As described above, the first terminal 21 is connected to the first pad 30 through the wiring 32, and the second terminal 22 is connected to the second pad 31 through the wiring 33.

In addition, a third terminal 23 is provided on the inner wall of the third concave portion 27 applied to the first sidewall 12 and the second sidewall 13. In addition, a fourth terminal 24 is provided on the inner wall of the fourth concave portion 28 applied to the first sidewall 12 and the second sidewall 13. Meanwhile, the first terminal 21 and the fourth terminal 24 are disposed at point-symmetric positions to each other with reference to the center of the base substrate 45 when seen in plan view. In addition, the second terminal 22 and the third terminal 23 are disposed at point-symmetric positions to each other with reference to the center of the base substrate 45 when seen in plan view. In this manner, four terminals of the first terminal 21 to the fourth terminal 24 are disposed, and thus the terminals are disposed at the same positions even when the direction of the package 16 is reversed. Therefore, a measurement terminal (pin probe) and the like can be brought into contact with the terminals at the same positions in any of the directions.

The third terminal 23 and the fourth terminal 24 are electrically connected to each other by a connection wiring 34 provided between the first sidewall 12 and the second sidewall 13. In other words, the third terminal 23 and the fourth terminal 24 are electrically short-circuited to each other. The connection wiring 34 is formed by performing baking after the formation of a required shape using tungsten metallization or the like. The electrical resistivity of tungsten is appropriately 53 nΩ·m. Thus, when the connection wiring 34 using tungsten is used, the electric resistance value between the third terminal 23 and the fourth terminal 24 shows a predetermined value depending on the length of the connection wiring 34.

In this manner, when there is a predetermined electric resistance value between the third terminal 23 and the fourth terminal 24, the electric resistance value is different from that in a short circuit of the electric wirings using gold or the like, the electrodes of the resonator element 20, or the like, as a result of performing the measurement thereof by bringing a probe or the like as a measurement portion with the third terminal 23 and the fourth terminal 24. Therefore, it is possible to determine the short circuit of the electric wirings, the electrodes of the resonator element 20, or the like. In other words, by comparing the electric resistance value in a short circuit between the first terminal 21 and the second terminal 22 with the electric resistance value between the third terminal 23 and the fourth terminal 24, it can be determined whether either the first terminal 21 and the second terminal 22, or the third terminal 23 and the fourth terminal 24 are directed to the probe. Thereby, it is possible to determine the direction of the package 16.

In addition, the third terminal 23 and the fourth terminal 24 are electrically connected to one terminal (fifth terminal) 38 within the PAD electrode 37, and thus, as described above, it can be determined whether either the first terminal 21 and the second terminal 22, or the third terminal 23 and the fourth terminal 24 are directed to the probe. That is, a potential between the first terminal 21 and the second terminal 22 and a potential between the third terminal 23 and the fourth terminal 24 are compared with each other, and thus it can be determined whether either the first terminal 21 and the second terminal 22, or the third terminal 23 and the fourth terminal 24 are directed to the probe. Meanwhile, when the one terminal (fifth terminal) 38 is a GND terminal, a potential is stabilized, and is suitable for performing reliable confirmation (determination).

As described above, the first terminal 21 and the second terminal 22 are provided on the inner walls of the first concave portion 25 and the second concave portion 26 which are provided on the first lateral face 45a of the base substrate 45, and the third terminal 23 and the fourth terminal 24 are provided on the inner walls of the third concave portion 27 and the fourth concave portion 28 which are provided on the second lateral face 45b of the base substrate 45. Thereby, it is possible to perform the measurement of the resonator element 20 from the lateral face side of the package 16, and to perform processing from the plane side (opening side of the concave portion) of the package 16 while performing the measurement.

Meanwhile, in this configuration, a description is made by way of an example in which one terminal is provided in one concave portion so that the first terminal 21 is provided in the first concave portion 25 and the second terminal 22 is provided in the second concave portion 26, but a plurality of terminals may be provided in one concave portion. In addition, in this configuration, a description is made by way of an example in which two terminals (first terminal 21 and second terminal 22, third terminal 23 and fourth terminal 24) are provided on one side of the package, but as long as the number of terminals is two or more, the number does not matter.

The lid 15 is a plate-like member, and blocks the opening of the concave portion opened on the upper surface of the package 16. The periphery of the opening of the concave portion is bonded thereto using, for example, a seam welding method or the like. Since the lid 15 of this example is plate-like, the lid is easily formed, and is excellent in shape stability. In addition, a plate material of Kovar is used in the lid 15 of this example. When sealing is performed by using the plate material of Kovar in the lid 15, the seam ring 14 and the lid 15 which are formed of Kovar are molten in the same molten state, and are easily alloyed. Therefore, it is possible to perform sealing easily and reliably. Meanwhile, other plate materials may be used in the lid 15 as a substitute for Kovar, and a metal material such as, for example, 42 Alloy and stainless steel, the same material as that of the second sidewall 13 of the package 16, or the like can be used in the lid.
Circuit Element The circuit element 35 is disposed on the bottom plate 11, and is connected to the bottom plate 11 by a resin-based adhesive or the like. The circuit element 35 includes, for example, an oscillation circuit that oscillates the resonator element 20, or the like. An electrode pad (not shown) is provided on the active surface of the circuit element 35, and the electrode pad and the PAD electrode 37 which is provided on the stepped portion of the first sidewall 12 constituting the base substrate 45 are electrically connected to each other by metal interconnections (bonding wires) 36.
Method of Manufacturing Oscillator Next, a method of manufacturing the oscillator 10 as the electronic device according to the first embodiment having the above-mentioned configuration will be described with reference to a flow diagram shown in FIG. 2. Meanwhile, the configuration of the oscillator 10 will be described also with reference to FIGS. 1A to 1C.

First, the package 16 having the concave portion (internal space 17) opened on the upper surface as shown in FIGS. 1A to 1C is prepared. The tuning fork type resonator element 20 is connected to the first pad 30 and the second pad 31. The resonator element 20 is configured such that one support arm 18 is connected to the first pad 30, and the other support arm 19 is electrically connected to the second pad 31 using the conductive adhesive 29.

Next, the characteristics of the resonator element 20 connected to the package 16 are measured by a measuring device including two pin probes as measurement portions that measure the characteristics of the resonator element 20. Such measurement will be described with reference to the flow diagram.

First, the two pin probes as measurement portions are brought into contact with two terminals provided on one lateral face of the base substrate 45, and the characteristics of the resonator element 20 are measured (first measurement: step S101). Here, the two pin probes are brought into contact with any pair of terminals of the first terminal 21 and the second terminal 22, and the third terminal 23 and the fourth terminal 24, depending on the arrangement direction of the package 16. The resonator element 20 is vibrated by applying a measurement signal, the characteristics thereof are measured, and quality determination is performed (first confirmation: step S103).

When the characteristics are determined to be "non-defective: OK" (step S103: Yes) by this measurement, the resonator element 20 is determined to be a "non-defective product", and the measurement is terminated. In this case, the pin probe is brought into contact with the first terminal 21 and the second terminal 22.

When the characteristics are determined to be "defective: NG" (step S103: No) by the first confirmation (step S103), it is determined whether the terminals measured by the next second confirmation (step S105) are in a desired electrical conduction state (for example, short (short circuit)). In this measurement, an electric resistance value between two terminals where the pin probe is brought into contact is measured, and it is also measured whether the value is a predetermined electric resistance value such as that between the third terminal 23 and the fourth terminal 24.

When it is determined to be in a connection state (for example, short (short circuit)) having the predetermined electric resistance value (step S105: Yes), it is determined that the pin probe is brought into contact with the third terminal 23 and the fourth terminal 24, that is, the direction of the package is reversed, and the characteristics are measured again by reversing the direction of the package 16 (second measurement: step S107). In addition, when the characteristics are determined to be "defective: NG" (step S105: No) by the measurement in the second determination (step S105), the resonator element 20 is determined to be defective. In this case, the resonator element 20, the wirings 32 and 33, and the like are also determined to be defective with respect to shorts (short circuits) having electric resistance values other than the predetermined electric resistance value, and the measurement is terminated.

In the second measurement (step S107), when the characteristics are determined to be "defective: NG" (step S107: No), the resonator element 20 is determined to be defective. In addition, in the second measurement (step S107), when the characteristics are determined to be "non-defective: OK" (step S107: Yes), the resonator element 20 is determined to be "non-defective product", and a series of measurements are terminated.

Such a series of measurements are performed, and thus a defect of the resonator element 20 as an electronic component or a mismatch of the direction of the oscillator 10 as an electronic device is determined in the first measurement (step S101) and the first determination (step S103). In a case of the mismatch of the direction of the oscillator 10, the direction is corrected (reversed) and then the measurement is performed again in the second measurement (step S107), thereby allowing the measurement to be terminated. In this manner, it is possible to perform the measurement efficiently.

Next, the circuit element 35 is fixed, by an adhesive (not shown), to the bottom plate 11 of the concave portion of the package 16 in which the resonator element 20 is determined to be a non-defective product. Thereafter, the electrode pad (not shown) provided on the active surface of the circuit element 35, and the PAD electrode 37 provided on the stepped portion of the first sidewall 12 constituting the package 16 are connected to each other by the metal interconnections (bonding wires) 36.

Next, after the frequency of the resonator element 20 is adjusted, the lid 15 is bonded to the second sidewall 13 through the seam ring 14 using, for example, a seam welding method. Thereby, the opening of the concave portion of the package 16 is blocked, and the sealed internal space 17 is formed. The sealed internal space 17 is set to have a vacuum (state of a space filled with a gas of a pressure ($1 \times 10^5$ Pa to $1 \times 10^{-10}$ Pa or lower (JIS Z 8126-1: 1999)) lower than the normal atmospheric pressure).

Next, a process of manufacturing the oscillator 10 is terminated by inspecting the electric characteristics of the oscillator 10 and performing quality determination, and the oscillator 10 is completed.

Figure 3A:
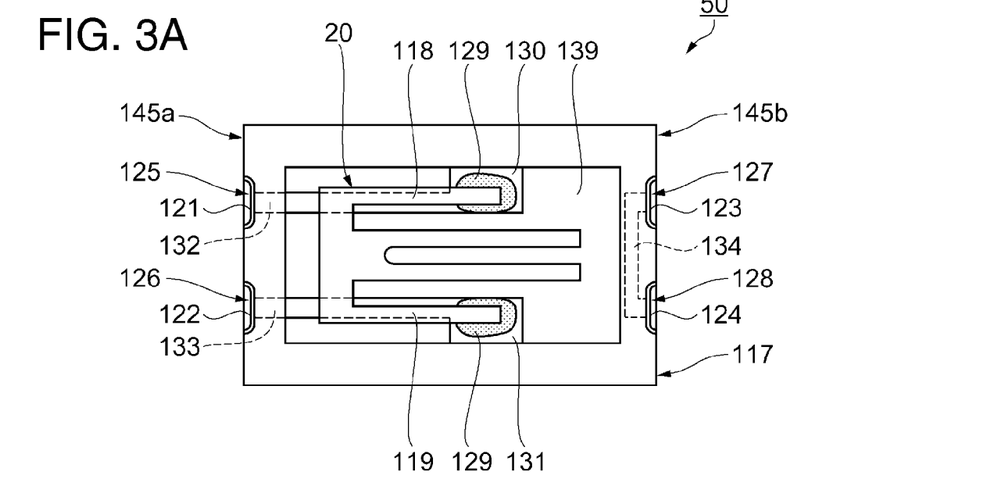
FIG. 3A is a plan view.
Figure 3B:
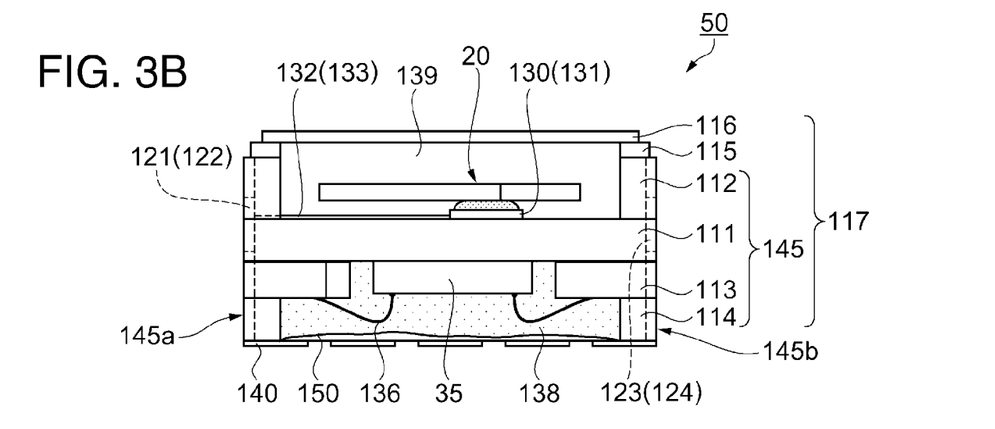
FIG. 3B is a front cross-sectional view.
Figure 3C:
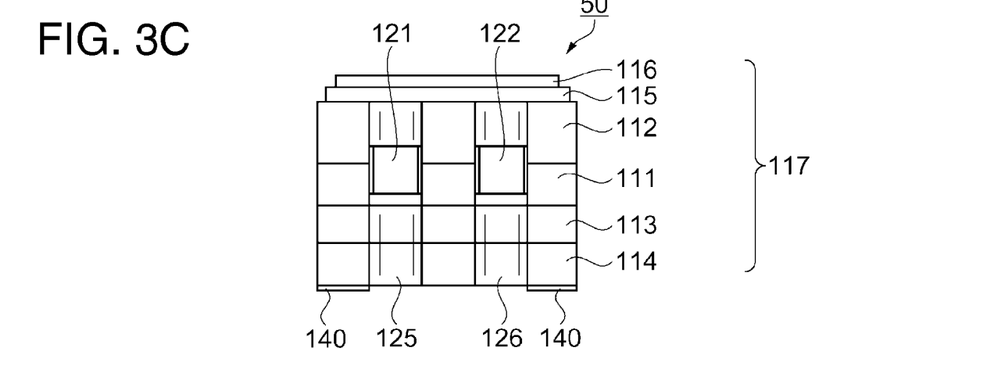
FIG. 3C is a left side view of FIG. 3B.

In the oscillator 10 as the electronic device according to the above-mentioned first embodiment, the direction of the package 16 as the circuit substrate, that is, the direction of the oscillator 10 can be determined reliably through one-time measurement. Therefore, it is possible to provide the package 16 as the circuit substrate and the oscillator 10 as the electronic device which are capable of reducing measurement man-hours through determination with a small number of times of determination, that is, with good efficiency.
Second Embodiment Next, an electronic device according to a second embodiment of the invention will be described with reference to FIGS. 3A to 3C. FIGS. 3A to 3C are diagrams illustrating an outline of the electronic device according to the second embodiment of the invention; FIG. 3A is a plan view in which a lid as a lid member is omitted, FIG. 3B is a front cross-sectional view, and FIG. 3C is a left side view when FIG. 3B is seen from the left side. Meanwhile, in the following, the electronic device according to the second embodiment will be described by taking an example of an oscillator including a tuning fork type resonator element as an electronic component. In addition, the same components as those of the oscillator 10 according to the aforementioned first embodiment are denoted by the same reference numerals and signs, and thus the description thereof will not be given.

Oscillator

An oscillator 50 as the electronic device according to the second embodiment which is shown in FIGS. 3A, to 3C includes the resonator element 20, the circuit element 35 having at least a function of driving the resonator element 20, and a package 117 that stores the resonator element 20 and the circuit element 35. The oscillator 50 is different from the oscillator 10 as the electronic device according to the aforementioned first embodiment, in the arrangement positions of the resonator element 20 and the circuit element 35. Hereinafter, a description will be given with an emphasis on the package 117 having a configuration different from that of the first embodiment. The resonator element 20 and the circuit element 35 having the same configurations as above are denoted by the same reference numerals and signs, and thus the description thereof will not be given. In addition, the configurations of a seam ring 115 and a lid 116 constituting the package 117 are the same as those of the first embodiment, and thus the detailed description thereof will not be given.

Package

The package 117 as a circuit substrate shown in FIGS. 3A to 3C includes a base substrate 145 which is provided with a bottom plate 111, a frame-like first sidewall 112 provided in the periphery of one side of the bottom plate 111, a frame-like second sidewall 113 provided in the periphery of the other side (rear side) of the bottom plate 111, and a frame-like third sidewall 114 overlapping the second sidewall 113, the seam ring 115 as a bonding material provided on the upper surface of the first sidewall 112, and the lid 116 as a lid member bonded to the first sidewall 112 through the seam ring 115.

The package 117 as a circuit substrate includes a concave portion (internal space 139) opened on the upper surface and a concave portion 150 opened on the lower surface. An opening of the internal space 139 is sealed by the lid 116 bonded to the first sidewall 112 through the seam ring 115 as a bonding material. The internal pressure of the sealed internal space 139 can be set to a desired atmospheric pressure. For example, the internal pressure is set to the atmospheric pressure in which a nitrogen gas is filled into the internal space 139, or is set to a vacuum (state of a space filled with a gas of a pressure ($1 \times 10^5$ Pa to $1 \times 10^{-10}$ Pa or lower (JIS Z 8126-1: 1999)) lower than the normal atmospheric pressure), and thus it is possible for more stable resonation of the resonator element 20 to continue. Meanwhile, the internal space 139 of the present embodiment stores the tuning fork type resonator element 20, and thus is set to have the above-mentioned vacuum. In addition, the concave portion 150 opened on the lower surface is provided on the opposite side to the internal space 139 with the bottom plate 111 interposed therebetween. The circuit element 35 is stored in the concave portion 150.

The frame-like first sidewall 112 is provided in a substantially rectangular circumferential shape. In other words, the opening shape opened on the upper surface of the above concave portion is substantially rectangular. The bottom plate 111 and the concave portion surrounded by the frame-like first sidewall 112 serve as the internal space (storage space) 139 for storing the resonator element 20. A first pad 130 and a second pad 131 are provided on the upper surface of the bottom plate 111. The first pad 130 and the second pad 131 are terminals for connecting the resonator element 20. A support arm 118 of the resonator element 20 is connected to the first pad 130 by a conductive adhesive 129, and a support arm 119 of the resonator element 20 is connected to the second pad 131 by the conductive adhesive 129. In this manner, the resonator element 20 is connected to the bottom plate 111 within the internal space 139. The seam ring 115 formed of an alloy such as, for example, Kovar is provided on the upper surface of the frame-like first sidewall 112. The seam ring 115 has a function as a bonding material between the lid 116 and the first sidewall 112, and is provided in a frame shape (substantially rectangular circumferential shape) along the upper surface of the first sidewall 112.

The frame-like second sidewall 113 and the third sidewall 114 are provided in a substantially rectangular circumferential shape. In other words, the opening shape of the concave portion 150 is substantially rectangular. The second sidewall 113 is provided with an inner end having a lateral face which is located further toward the center side, in other words, the inner side of the package 117 than the third sidewall 114, and includes a portion having a stepped portion formed within the concave portion. The stepped portion formed by the second sidewall 113 is provided with a PAD electrode which is not shown. The bottom plate 111 and the concave portion 150 surrounded by the frame-like second sidewall 113 and the third sidewall 114 serve as a space for storing the circuit element 35. The circuit element 35 is connected to the rear side of the bottom plate 111, and the electrode pad (not shown) provided on the active surface of the circuit element 35 and the PAD electrode provided on the stepped portion of the second sidewall 113 are electrically connected to each other by a metal interconnection (bonding wire) 136. The circuit element 35 stored in the concave portion 150 is covered and sealed by a sealing material 138 injected into the concave portion 150.

The base substrate 145 is formed of a material having a thermal expansion coefficient which is consistent with, or as close as possible to, the thermal expansion coefficients of the resonator element 20 and the lid 116. In this example, ceramic is used. The base substrate 145 is formed by laminating and sintering a green sheet formed in a predetermined shape. Meanwhile, the green sheet is, for example, a material in which a kneaded material generated by dispersing ceramic powder in a predetermined solution and adding a binder is formed in a sheet shape.

The first pad 130 and the second pad 131 which are provided on the surface of the bottom plate 111, and a plurality of PAD electrodes (not shown) provided on the stepped portion of the second sidewall 113 are formed by performing baking after the formation of required shapes using, for example, a conductive paste such as a silver and palladium alloy or tungsten metallization, and then plating nickel (Ni), gold (Au), silver (Ag) or the like. The first pad 130 and the second pad 131 are connected to a first connection electrode (not shown) and a second connection electrode (not shown) which are provided in the support arms 118 and 119 of the resonator element 20. The first pad 130 is electrically connected to a first terminal 121, provided in a first concave portion 125 of a first lateral face 145a of the base substrate 145, through a wiring 132. The second pad 131 is electrically connected to a second terminal 122, provided in a second concave portion 126 of the first lateral face 145a of the base substrate 145, through a wiring 133. Therefore, one excitation electrode (not shown) of the resonator element 20 is electrically connected to the first terminal 121 through the first connection electrode, the first pad 130, and the wiring 132. In addition, the other excitation electrode (not shown) of the resonator element 20 is electrically connected to the second terminal 122 through the second connection electrode, the second pad 131, and the wiring 133. The plurality of PAD electrodes are electrically connected to any of external connection terminals 140 through a wiring which is not shown. Meanwhile, the wirings 132 and 133 can be formed as is the case with the above-mentioned first pad 130 and the like.

Two lateral faces (first lateral face 145a and second lateral face 145b) on the short side of the base substrate 145 are provided with two concave portions (castellation) reaching from the top face of the first sidewall 112 to the lower surface of the third sidewall 114. The first concave portion 125 and the second concave portion 126 are provided on one first lateral face 145a. In addition, a third concave portion 127 and a fourth concave portion 128 are provided on the second lateral face 145b on the side facing the first lateral face 145a provided with the first concave portion 125 and the second concave portion 126. The first terminal 121 is provided on the inner wall of the first concave portion 125 applied to the bottom plate 111 and the first sidewall 112. In addition, the second terminal 122 is provided on the inner wall of the second concave portion 126 applied to the bottom plate 111 and the first sidewall 112. As described above, the first terminal 121 is connected to the first pad 130 through the wiring 132, and the second terminal 122 is connected to the second pad 131 through the wiring 133.

In addition, a third terminal 123 is provided on the inner wall of the third concave portion 127 applied to the bottom plate 111 and the first sidewall 112. In addition, a fourth terminal 124 is provided on the inner wall of the fourth concave portion 128 applied to the bottom plate 111 and the first sidewall 112. Meanwhile, the first terminal 121 and the fourth terminal 124 are disposed at point-symmetric positions to each other with reference to the center of the base substrate 145 when seen in plan view. In addition, the second terminal 122 and the third terminal 123 are disposed at point-symmetric positions to each other with reference to the center of the base substrate 145 when seen in plan view. In this manner, four terminals of the first terminal 121 to the fourth terminal 124 are disposed, and thus the terminals are disposed at the same positions even when the direction of the package 117 is reversed. Therefore, a measurement terminal (pin probe) and the like can be brought into contact with the terminals at the same positions in any of the directions.

The third terminal 123 and the fourth terminal 124 are electrically connected to each other by a connection wiring 134 provided between the bottom plate 111 and the first sidewall 112. In other words, the third terminal 123 and the fourth terminal 124 are electrically short-circuited to each other. The connection wiring 134 is formed by performing baking after the formation of a required shape using tungsten metallization or the like. The electrical resistivity of tungsten is appropriately 53 nΩ·m. Thus, when the connection wiring 134 using tungsten is used, the electric resistance value between the third terminal 123 and the fourth terminal 124 shows a predetermined value depending on the length of the connection wiring 134.

In this manner, when there is a predetermined electric resistance value between the third terminal 123 and the fourth terminal 124, the electric resistance value is different from that in a short circuit of the electric wirings using gold or the like, the electrodes of the resonator element 20, or the like, as a result of performing the measurements thereof by bringing a probe or the like as a measurement portion with the third terminal 123 and the fourth terminal 124. Therefore, it is possible to determine the short circuit of the electric wirings, the electrodes of the resonator element 20, or the like. In other words, by comparing the electric resistance value in a short circuit between the first terminal 121 and the second terminal 122 with the electric resistance value between the third terminal 123 and the fourth terminal 124, it can be determined whether either the first terminal 121 and the second terminal 122, or the third terminal 123 and the fourth terminal 124 are directed to the probe. Thereby, it is possible to determine the direction of the package 117.

In addition, the third terminal 123 and the fourth terminal 124 are electrically connected to a GND terminal, and thus, as described above, it can be determined whether either the first terminal 121 and the second terminal 122, or the third terminal 123 and the fourth terminal 124 are directed to the probe. That is, a potential between the first terminal 121 and the second terminal 122 and a potential between the third terminal 123 and the fourth terminal 124 are compared with each other, and thus it can be determined whether either the first terminal 121 and the second terminal 122, or the third terminal 123 and the fourth terminal 124 are directed to the probe.

As described above, the first terminal 121 and the second terminal 122 are provided on the inner walls of the first concave portion 125 and the second concave portion 126 which are provided on the first lateral face 145a of the base substrate 145, and the third terminal 123, and the fourth terminal 124 are provided on the inner walls of the third concave portion 127 and the fourth concave portion 128 which are provided on the second lateral face 145b of the base substrate 145. Thereby, it is possible to perform the measurement of the resonator element 20 from the lateral face side of the package 117, and to perform processing from the plane side (opening side of the concave portion) of the package 117 while performing the measurement.

Meanwhile, in this configuration, a description is made by way of an example in which one terminal is provided in one concave portion so that the first terminal 121 is provided in the first concave portion 125 and the second terminal 122 is provided in the second concave portion 126, but a plurality of terminals may be provided in one concave portion. In addition, in this configuration, a description is made by way of an example in which two terminals (first terminal 121 and second terminal 122, the third terminal 123 and fourth terminal 124) are provided on one side of the package, but as long as the number of terminals is two or more, the number does not matter.

Method of Manufacturing Oscillator

A method of manufacturing the oscillator 50 is different from the method of manufacturing the oscillator 10 according to the aforementioned first embodiment, in the connection position and sealing method of the circuit element 35, but a process of measuring the characteristics of the resonator element 20 which is described using the flow diagram in the aforementioned first embodiment is the same process, and thus the description thereof will not be given.

In the oscillator 50 as the electronic device according to the above-mentioned second embodiment, the direction of the package 117 as the circuit substrate, that is, the direction of the oscillator 50 can be determined reliably through one-time measurement. Therefore, it is possible to provide the package 117 as the circuit substrate and the oscillator 50 as the electronic device which are capable of reducing measurement man-hours through determination with a small number of times of determination, that is, with good efficiency.

In addition, in the first embodiment and the second embodiment mentioned above, a ceramic substrate has been described by way of example of a material constituting the base substrates 45 and 145, but, for example, a quartz crystal substrate, a glass substrate, a silicon substrate or the like can also be used without being limited thereto.

In addition, in the first embodiment and the second embodiment mentioned above, the sealing of the packages 16 and 117 has been described based on the configuration in which the lids 15 and 116 as lid bodies are bonded to the second sidewall 13 or the first sidewall 112 through the seam rings 14 and 115, but is not limited thereto. As long as the package can be sealed air-tightly, the configuration thereof does not matter. For example, a configuration may be used in which a metal cap having a concave internal space formed therein is bonded onto a ceramic substrate by a seam welding method or the like.

In addition, in the first embodiment and the second embodiment mentioned above, a description has been made using the oscillator including a tuning fork type resonator element as an example of an electronic device, but is not limited thereto. For example, a vibrator or an oscillator having a resonator element of other forms such as an AT cut or a CT cut stored therein, a sensor device having a sensor element capable of measuring acceleration, angular velocity, pressure or the like stored therein instead of the resonator element, a semiconductor device having a circuit element stored therein, and the like can also be applied thereto.

Electronic Apparatus

Next, as an electronic device according to an embodiment of the invention, an electronic apparatus to which either the oscillator 10 using the package 16 as a circuit substrate or the oscillator 50 using the package 117 as a circuit substrate is applied will be described in detail with reference to FIGS. 4 to 6. Meanwhile, the following description shows examples to which the oscillator 10 is applied.

Figure 4:
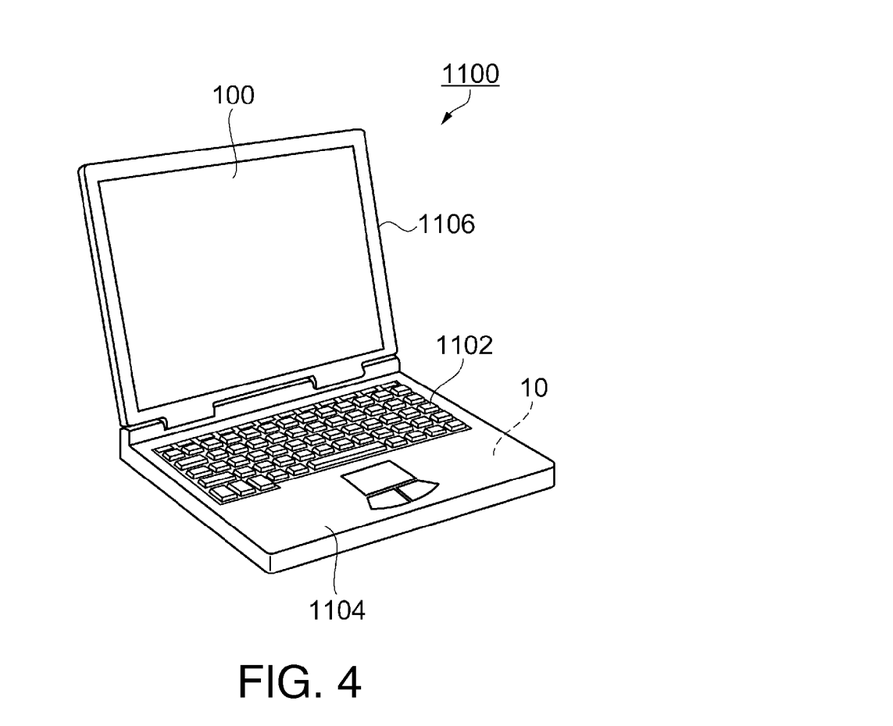
FIG. 4 is a perspective view illustrating a configuration of a mobile-type personal computer as an example of an electronic apparatus.

FIG. 4 is a perspective view illustrating an outline of a configuration of a mobile-type (or notebook-type) personal computer as an electronic apparatus including the oscillator 10 as the electronic device according to the embodiment of the invention. In the drawing, a personal computer 1100 is constituted by a main body 1104 including a keyboard 1102 and a display unit 1106 including a display portion 100, and the display unit 1106 is rotatably supported with respect to the main body 1104 through a hinge structure. Such a personal computer 1100 has the oscillator 10 built-in which functions as a signal processing timing source.

Figure 5:
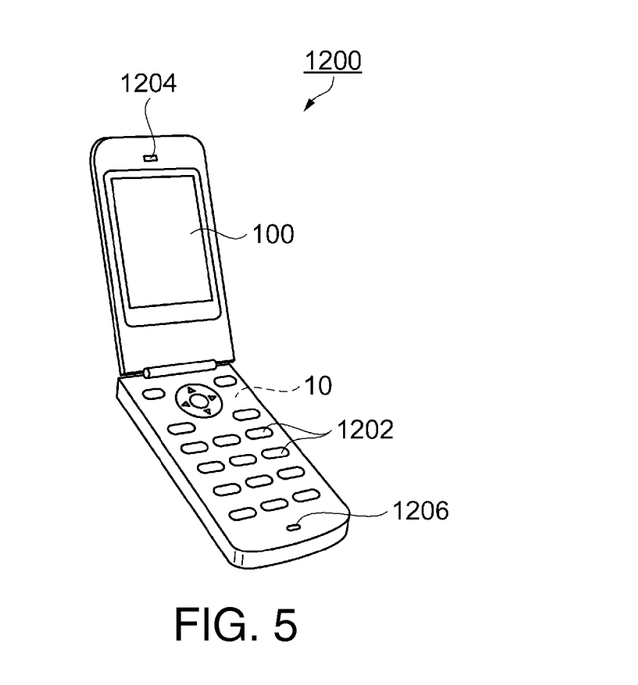
FIG. 5 is a perspective view illustrating a configuration of a cellular phone as an example of an electronic apparatus.

FIG. 5 is a perspective view illustrating an outline of a configuration of a cellular phone (also including PHS) as an electronic apparatus including the oscillator 10 as the electronic device according to the embodiment of the invention. In the drawing, a cellular phone 1200 includes a plurality of operation buttons 1202, an ear piece 1204 and a mouth piece 1206, and the display portion 100 is disposed between the operation buttons 1202 and the earpiece 1204. Such a cellular phone 1200 has the oscillator 10 built-in having a function as a signal processing timing source.

Figure 6:
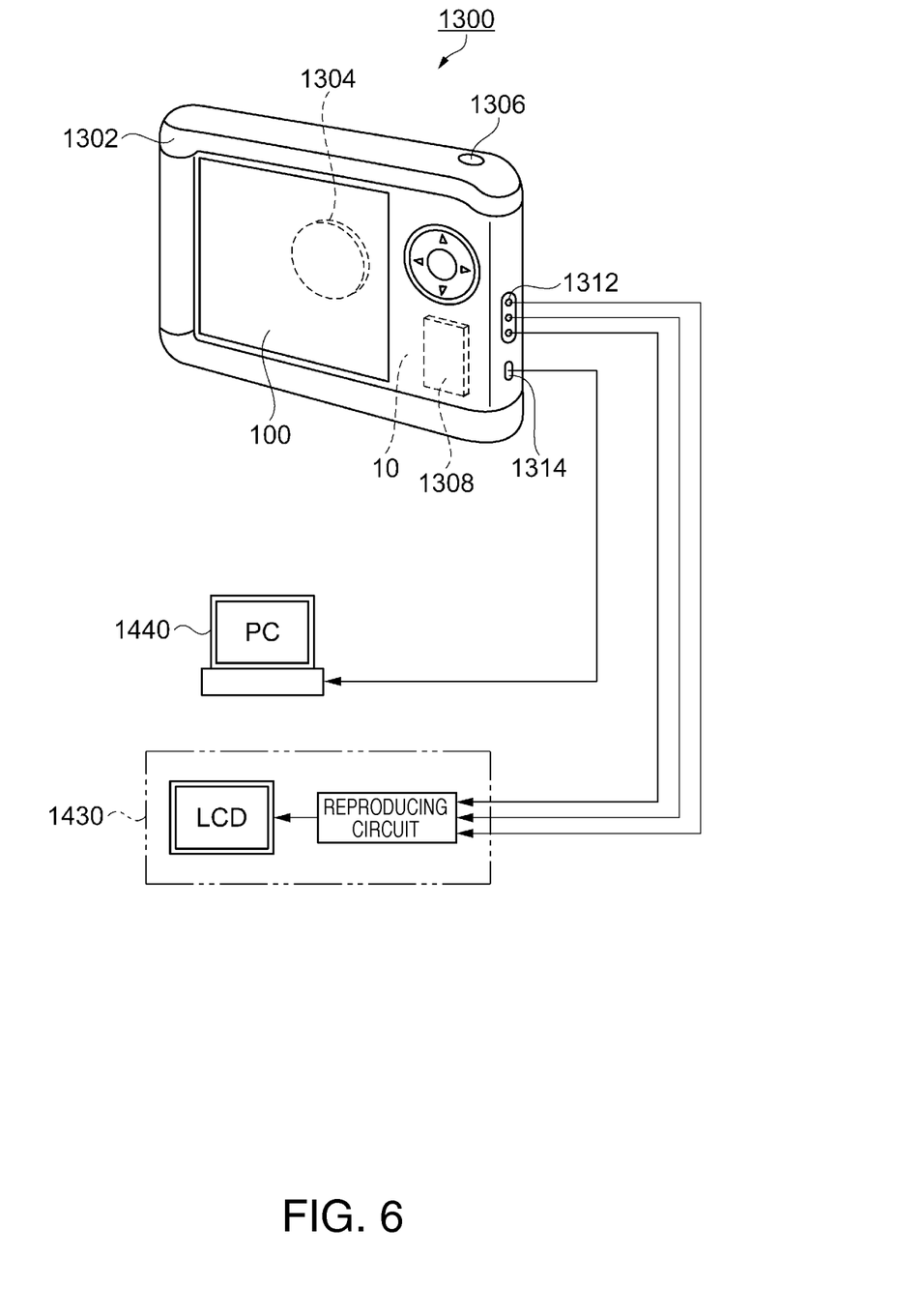
FIG. 6 is a perspective view illustrating a configuration of a digital still camera as an example of an electronic apparatus.

FIG. 6 is a perspective view illustrating an outline of a configuration of a digital still camera as an electronic apparatus including the oscillator 10 as an electronic device according to the embodiment of the invention. Meanwhile, in the drawing, the connection with an external device is also shown simply. Here, a film camera of the related art exposes a silver halide photo film through a light image of a subject, whereas a digital still camera 1300 generates an imaging signal (image signal) by photoelectrically converting a light image of a subject using an imaging device such as a CCD (Charge Coupled Device).

The display portion 100 is provided on the rear face of a case (body) 1302 in the digital still camera 1300, and is configured to perform a display on the basis of an imaging signal of a CCD. The display portion 100 functions as a viewfinder for displaying a subject as an electronic image. In addition, a light-receiving unit 1304 including an optical lens (imaging optical system), a CCD and the like is provided on the front side (rear side in the drawing) of the case 1302.

When a photographer confirms a subject image displayed on the display portion 100 and pushes a shutter button 1306, an imaging signal of the CCD at that point in time is transmitted and stored to and in a memory 1308. In addition, in the digital still camera 1300, a video signal output terminal 1312 and an input and output terminal 1314 for data communication are provided on the lateral face of the case 1302. As shown in the drawing, a TV monitor 1430 is connected to the video signal output terminal 1312 and a personal computer 1440 is connected to the input and output terminal 1314 for data communication, respectively as necessary. Further, the imaging signal stored in the memory 1308 is output to the TV monitor 1430 or the personal computer 1440 by a predetermined operation. Such a digital still camera 1300 has the oscillator 10 built-in having a function as a signal processing timing source.

Meanwhile, in addition to the personal computer (mobile-type personal computer) of FIG. 4, the cellular phone of FIG. 5, and the digital still camera of FIG. 6, the oscillator 10 as the electronic device according to embodiment of the invention can be applied to electronic apparatuses such as, for example, an ink jet ejecting apparatus (for example, ink jet printer), a laptop personal computer, a television, a video camera, a video tape recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, a medical instrument (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), and a flight simulator.

Moving Object

Figure 7:
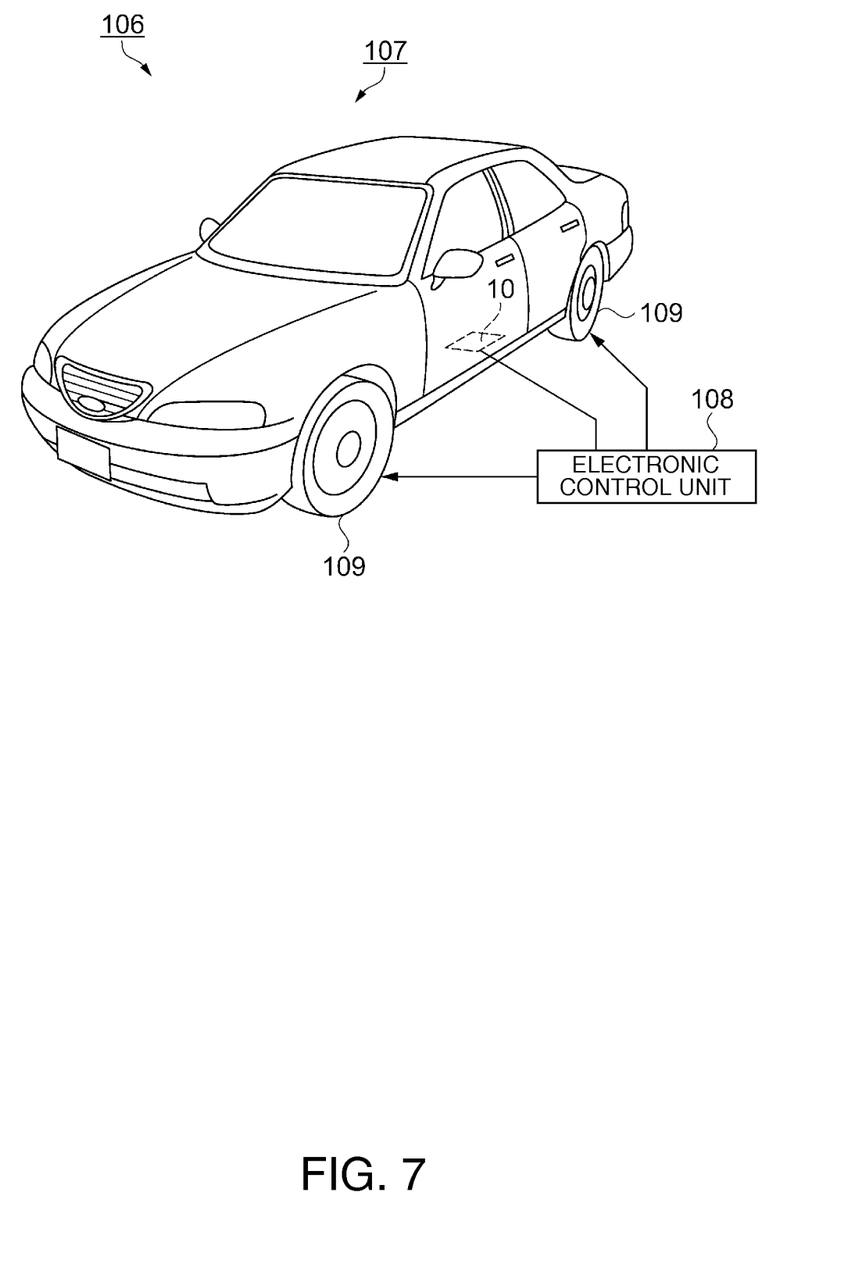
FIG. 7 is a perspective view illustrating a configuration of an automobile as an example of a moving object.

FIG. 7 is a perspective view schematically illustrating an automobile as an example of a moving object. The oscillator 10 as an electronic device according to the invention is mounted in an automobile 106. For example, as shown in the drawing, the automobile 106 as a moving object has the oscillator 10 built-in and has an electronic control unit 108, controlling tires 109 or the like, mounted to a car body 107. In addition, the oscillator 10 can be applied widely to electronic control units (ECUs) such as a keyless entry, an immobilizer, a car navigation system, a car air conditioner, an antilock brake system (ABS), an air bag, a tire pressure monitoring system (TPMS), engine control, a battery monitor of a hybrid automobile or an electric automobile, and a car-body posture control system.

The entire disclosure of Japanese Patent Application No. 2013-083822, filed Apr. 12, 2013 is expressly incorporated by reference herein.

What is claimed is:

1. A circuit substrate comprising:
   a base substrate including:
   a first pad and a second pad which are electrically connected to an electronic component;
   a first lateral face and a second lateral face which are located parallel to each other;
   a first terminal which is disposed on the first lateral face and is electrically connected to the first pad;

a second terminal which is disposed on the first lateral face and is electrically connected to the second pad; and a third terminal and a fourth terminal which are disposed on the second lateral face, wherein the first terminal and the fourth terminal are located at point-symmetric positions to each other with reference to a center of the base substrate, the second terminal and the third terminal are located at point-symmetric positions to each other with reference to the center, and the third terminal and the fourth terminal are electrically connected to each other;

wherein the third terminal and the fourth terminal are electrically connected to each other through an electric resistor.

2. The circuit substrate according to claim 1, wherein a fifth terminal is included in the base substrate, and the third terminal and the fourth terminal are electrically connected to the fifth terminal.

3. The circuit substrate according to claim 2, wherein the fifth terminal is connected to a ground potential.

4. The circuit substrate according to claim 1, wherein the first terminal and the second terminal are provided in a first concave portion included on the first lateral face, and the third terminal and the fourth terminal are provided in a second concave portion included on the second lateral face.

5. An electronic device comprising:

the circuit substrate according to claim 1; and the electronic component which is disposed in the circuit substrate, and is provided with a first connection terminal which is electrically connected to the first terminal and a second connection terminal which is electrically connected to the second terminal.

6. An electronic apparatus comprising the circuit substrate according to claim 1.

7. A moving object comprising the circuit substrate according to claim 1.

8. The circuit substrate according to claim 1, wherein the base substrate is in a rectangular shape in a plan view.

9. A circuit substrate comprising:

a base substrate including:

a first pad and a second pad which are electrically connected to an electronic component;

a first lateral face and a second lateral face which are located parallel to each other;

a first terminal which is disposed on the first lateral face and is electrically connected to the first pad;

a second terminal which is disposed on the first lateral face and is electrically connected to the second pad; and a third terminal and a fourth terminal which are disposed on the second lateral face, wherein the first terminal and the fourth terminal are located at point-symmetric positions to each other with reference to a center of the base substrate, the second terminal and the third terminal are located at point-symmetric positions to each other with reference to the center, and the third terminal and the fourth terminal are electrically connected to each other without electrically connecting to the electronic component.

10. The circuit substrate according to claim 9, wherein the base substrate is in a rectangular shape in a plan view.

11. The circuit substrate according to claim 9, wherein the third terminal and the fourth terminal are electrically short-circuited to each other.

12. The circuit substrate according to claim 9, wherein the third terminal and the fourth terminal are electrically connected to each other through an electric resistor.

13. The circuit substrate according to claim 9, wherein a fifth terminal is provided in the base substrate, and the third terminal and the fourth terminal are electrically connected to the fifth terminal.

14. The circuit substrate according to claim 13, wherein the fifth terminal is connected to a ground potential.

15. The circuit substrate according to claim 12, wherein the first terminal and the second terminal are provided in a first recess located in the first lateral face, and the third terminal and the fourth terminal are provided in a second recess located in the second lateral face.

16. An electronic device comprising:

the circuit substrate according to claim 12; and the electronic component which is disposed in the circuit substrate, and is provided with a first connection terminal which is electrically connected to the first terminal and a second connection terminal which is electrically connected to the second terminal.

17. An electronic apparatus comprising the circuit substrate according to claim 9.

18. A moving object comprising the circuit substrate according to claim 9.

* * * * *